(12) United States Patent
Choi et al.

(10) Patent No.: US 9,362,467 B2
(45) Date of Patent: Jun. 7, 2016

(54) FLAT PANEL DISPLAY DEVICE AND METHOD OF FABRICATING THE SAME

(71) Applicant: LG DISPLAY CO., LTD., Seoul (KR)

(72) Inventors: BongKi Choi, Goyang (KR); KwangSu Lim, Paju (KR); HyoDae Bae, Paju (KR); ChangNam Kim, Paju (KR); SangKyu Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 203 days.

(21) Appl. No.: 13/848,499

(22) Filed: Mar. 21, 2013

(65) Prior Publication Data

US 2013/0249877 A1    Sep. 26, 2013

(30) Foreign Application Priority Data

Mar. 22, 2012    (KR) .................... 10-2012-0029580

(51) Int. Cl.
| | | |
|---|---|---|
| *G02F 1/1343* | (2006.01) | |
| *H01L 33/52* | (2010.01) | |
| *G09G 3/20* | (2006.01) | |
| *H01L 27/32* | (2006.01) | |
| *H01L 51/52* | (2006.01) | |
| *H01L 27/12* | (2006.01) | |

(52) U.S. Cl.
CPC ........... *H01L 33/52* (2013.01); *G09G 3/20* (2013.01); *H01L 27/1248* (2013.01); *H01L 27/1262* (2013.01); *H01L 27/32* (2013.01); *H01L 51/5253* (2013.01); *H01L 2251/566* (2013.01)

(58) Field of Classification Search
CPC ................ G02F 1/13452; H01L 51/5012
USPC ..................... 349/149, 152; 313/504
See application file for complete search history.

(56) References Cited

U.S. PATENT DOCUMENTS

| | | | |
|---|---|---|---|
| 2003/0038913 A1* | 2/2003 | Choo ............................ | 349/149 |
| 2007/0241085 A1 | 10/2007 | Hiroya et al. | |
| 2009/0103010 A1* | 4/2009 | Okamoto et al. ............... | 349/73 |
| 2009/0134782 A1 | 5/2009 | Kim | |
| 2010/0195039 A1 | 8/2010 | Park | |
| 2010/0296034 A1* | 11/2010 | Kim ............................. | 349/110 |
| 2010/0301740 A1 | 12/2010 | Lee et al. | |
| 2011/0147748 A1 | 6/2011 | Baek | |
| 2012/0099056 A1* | 4/2012 | Lee et al. ...................... | 349/106 |

FOREIGN PATENT DOCUMENTS

| | | |
|---|---|---|
| CN | 101046591 A | 10/2007 |
| CN | 101901824 A | 12/2010 |
| CN | 102122649 A | 7/2011 |
| KR | 10-0903622 B1 | 6/2009 |

* cited by examiner

*Primary Examiner* — Thanh-Nhan P Nguyen
(74) *Attorney, Agent, or Firm* — Birch, Stewart, Kolasch & Birch, LLP

(57) ABSTRACT

Discussed is a flat panel display device in which a protective pattern is formed on a lower surface of an upper film so that when the upper film is cut, link lines of a display panel formed in a cutting region is not damaged.

10 Claims, 24 Drawing Sheets

FIRST LINK LINE

FIRST LINK LINE   SECOND LINK LINE

FLAT PANEL DISPLAY DEVICE AND METHOD OF FABRICATING THE SAME

CROSS-REFERENCE TO RELATED APPLICATION

This application claims priority to and the benefit of Korean Patent Application No. 10-2012-0029580, filed on Mar. 22, 2012, which is hereby incorporated by reference for all purposes as if fully set forth herein.

BACKGROUND OF THE INVENTION

1. Field of the Invention

Embodiments of the invention relate to a flat panel display device and a method of fabricating the same, and particularly, to a flat panel display device capable of reducing damage that may be done to a wiring region in which link lines are formed in cutting an upper film in order to open a pad part, and a method of fabricating the same.

2. Description of the Related Art

Recently, flexible displays fabricated to be bent, curved, warped, or the like, by using a substrate made of a flexible material such as plastic, or the like, have emerged as next-generation display devices to meet the demand for being employed in portable products such as electronic sheets, arm bands, wallets, notebook computers, and the like.

A flexible display is one of next-generation displays implemented on a thin substrate such as a plastic substrate so as to be folded or rolled like paper without being damaged, and currently, an organic light emitting diode (OLED) display that can be fabricated to have a thickness equal to or less than 1 mm looks promising.

An OLED display, being a self-luminous device, has good visibility in a dark area or even in the presence of ambient light. A response speed is an important barometer for determining performance of a mobile display, and since an OLED display has the fastest response speed, among available displays, the OLED display can display high quality video. Also, an OLED display is available in an ultra-thin design, making various mobile devices employing such an OLED display thinner. Hereinafter, a schematic structure of an OLED display will be described with reference to the accompanying drawings.

FIGS. 1A and 1B are schematic cross-sectional views according to a related art OLED display. First, referring to FIG. 1A, an OLED display includes a first substrate 10 in which a thin film transistor (TFT) and an OLED are formed and a second substrate 20 encapsulating a region in which the TFT and the OLED are formed. In this instance, in order to encapsulate the TFT and the OLED, an adhesive, or the like, may also be used instead of the second substrate 20.

When the OLED display is used as a flexible device, the first substrate 10 may be made of a plastic material. The first substrate 10 may be defined by a display region and a non-display region. A plurality of pixels including TFTs are formed in the display region and a driving circuit unit 10p for driving the plurality of pixels through the TFTs of the display region is formed in the non-display region. Thereafter, an OLED layer is formed in the display region. The OLED layer emits light of various colors under the control of the driving circuit unit 10p and the TFTs.

The second substrate 20 is formed to have a size corresponding to the display region, and this is to expose a space in which the driving circuit unit 10p is connected to a printed circuit board (PCB). The driving circuit unit 10p includes a plurality of pads formed to be connected to wirings of the display region, and the driving circuit unit 10p is connected to the PCB through the pads.

Thus, among an upper film 51 and a lower film 52 attached after the first substrate 10 and the second substrate 20 are attached, a region of the upper film 51 corresponding to the driving circuit unit 10p is required to be open. The upper film 51 and the lower film 52 may be protective films or polarizer films (or polarizing films) and have an area corresponding to the entire surface of the OLED display. When first attached, the region of the upper film 51 covers the driving circuit unit 10p. Thus, in order to remove the region of the upper film 51 covering the driving circuit unit 10p, a cutting process is performed on the region of the upper film 51.

The cutting process includes a method of using wet etching and a method of using a laser.

The method of using wet etching has difficulty in cutting a film having a fine area, and has a problem in relation to cost of an etching solution and processing of used etching solution.

Thus, the method of using a laser is preferred to wet etching. However, the method of using a laser has a problem in that a laser unit is pricy and a region in which link lines are formed may be affected. This will be described with reference to FIG. 1B.

The reason for using a laser in cutting the upper film 51 is to perfectly cut-off the region of the upper film 51. Namely, in the instance of a glass substrate or an insulating substrate, marks may be formed due to hard material characteristics of the substrate and the substrate may be subsequently twisted so as to be cut along the marks. However, in the instance of a film, this method cannot be used due to the flexible characteristics of the film, so in order to perfectly cut the film, a laser is selectively used.

Here, a laser beam is shot from above the upper film 51 (or a laser beam is focused on the upper film 51). A region to which a laser beam is shot may be a region overlapped with a region 'A' in which link lines connecting pads of the driving circuit unit 10p and the wirings of the display region are formed.

However, the moment the upper film 51 is completely cut, the laser beam may be directly shot to the region 'A' in which the link lines of the first substrate 10 are formed. At this time, the laser beam shot to the region 'A' in which the link lines are formed may damage the link lines. Since the link lines are configured to transfer signals for driving the plurality of pixels, damage to the link lines may cause a defective image to be displayed on the OLED display.

SUMMARY OF THE INVENTION

Therefore, an aspect of the detailed description is to form a protective pattern for protecting a region in which link lines are formed against a laser in a process of cutting an upper film in fabricating a flat panel display device.

To achieve these and other advantages and in accordance with the purpose of the invention, as embodied and broadly described herein, a flat panel display device includes: a display panel including a display part to display an image, a driving circuit part to drive the display part, and a boundary part defining a boundary between the display part and the driving circuit part and having link lines connecting the display part and the driving circuit part; an upper film attached to an upper surface of the display panel; and a protective pattern formed on a lower surface of the upper film at a region of the upper film that corresponds to the boundary part.

The protective pattern may be formed as a single pattern facing in one direction, and may be made of metal.

To achieve these and other advantages and in accordance with the purpose of the invention, as embodied and broadly described herein, a flat panel display device includes: a display panel including a display part to display an image, a driving circuit part for driving the display part, and a boundary part defining a boundary between the display part and the driving circuit part and having link lines connecting the display part and the driving circuit part; an upper film attached to an upper surface of the display panel; and a main protective pattern formed in a region of the display panel that corresponds to the link lines in the boundary part of the display panel.

The main protective pattern may be configured as a plurality of patterns overlapping with the same amount of link lines, respectively, or may be configured as a single pattern overlapping with all the link lines.

When the boundary part is divided into a first boundary part and a second boundary part and the link lines are divided into first link lines formed in the first boundary part to transfer a gate signal and second link lines formed in a layer different from that of the first link lines in the second boundary part to transfer a data signal, the flat panel display device may further include an auxiliary protective pattern formed on a layer on which one of the first and second link lines is formed in an upper side of an insulating layer, and overlapping with the other of the first and second link lines formed in a lower side of the insulating layer.

The main protective pattern may include polyimide (PI).

The display panel may be an organic light emitting display panel encapsulated by a polyimide substrate, a glass substrate, or an adhesive layer.

The upper film may be a protective film or a polarizer film.

To achieve these and other advantages and in accordance with the purpose of the invention, as embodied and broadly described herein, a method of fabricating a flat panel display device, includes: forming a display panel having a display part displaying an image, a driving circuit part to drive the display part, and a boundary part defining a boundary between the display part and the driving circuit part and having link lines connecting the display part and the driving circuit part; forming a protective pattern in one region of an upper film; attaching the upper film to an upper surface of the display panel such that the protective pattern corresponds to the boundary part of the display panel; shooting a laser beam to a region in which the protective pattern is formed from an upper side of the display panel on which the upper film is attached, to cut the upper film; and removing a portion of the upper film that overlaps with the driving circuit part.

In the cutting of the upper film, the display panel may be moved at a speed ranging from 285 mm/s to 295 mm/s under the laser unit and the laser beam is shot to the region in which the protective pattern is formed.

To achieve these and other advantages and in accordance with the purpose of the invention, as embodied and broadly described herein, a method of fabricating a flat panel display device, includes: forming a substrate having a display part, a driving circuit part, and a boundary part defined between the display part and the driving circuit part; forming a thin film transistor (TFT) in the display part of the substrate, forming a pad part in the driving circuit part, and forming a link line connecting the pad part and the TFT in the boundary part; forming an organic light emitting diode (OLED) layer in the display part of the substrate in which the TFT is formed; forming a main protective pattern in the boundary part simultaneously when the OLED layer is formed; encapsulating the display part of the substrate; attaching an upper film to an upper surface of the substrate; shooting a laser beam to a region in which the main protective pattern is formed from an upper side of the display panel to which the upper film is attached, to cut the upper film; and removing the upper film separated from the display panel.

When the boundary part is defined by a first boundary part and a second boundary part, the forming of the TFT, the pad part, and the link line may include: forming first link lines for transferring a gate signal to the first boundary part; forming an insulating layer on the entire surface of the substrate on which the first link lines are formed; and forming an auxiliary protective pattern overlapping with the first link lines in the first boundary part on an upper portion of the insulating layer, and forming second link lines transferring a data signal in the second boundary part on an upper portion of the insulating layer.

In the instance of the flat panel display device and the method of fabricating a flat panel display device in relation to at least one embodiment of the invention configured as described above, since the protective pattern for protecting a region of the display panel in which link lines are formed against a laser beam in cutting the upper film is formed, damage that may be done to the link lines can be prevented. Thus, since such damage is prevented, a stable operation of the flat panel display device can be secured and reliability thereof can be enhanced.

Further scope of applicability of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate example embodiments and together with the description serve to explain the principles of the invention.

In the drawings.

DETAILED DESCRIPTION OF THE EMBODIMENTS

Figure 1A:
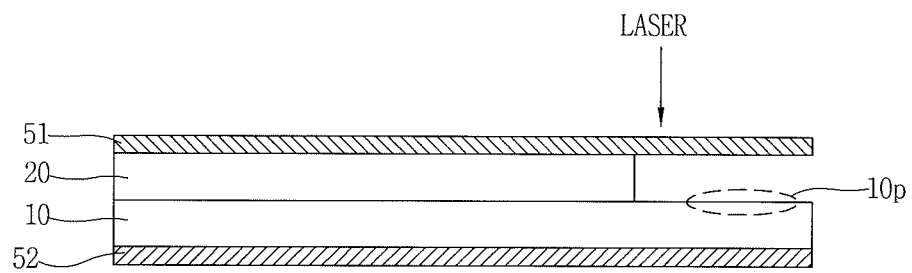
FIGS. 1A and 1B are schematic cross-sectional views of a related art organic light emitting diode (OLED) display device.
Figure 1B:
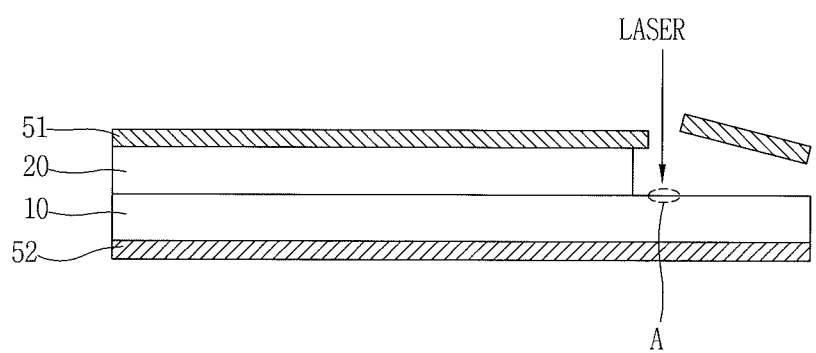

Hereinafter, a liquid crystal display (LCD) device and a method of fabricating an LCD device according to embodiments of the invention will be described in detail with reference to the accompanying drawings.

In the embodiments of the invention, the same or similar elements of different embodiments are given like or similar reference numerals and a description thereof will be provided once.

Singular forms "a", "an" and "the" in the disclosure are intended to include the plural forms as well, unless the context clearly indicates otherwise.

In the drawings, the shapes and dimensions of elements may be exaggerated for clarity, and the same reference numerals will be used throughout to designate the same or like components.

While terms such as "first" and "second," etc., may be used to describe various members, components, regions, layers, and/or parts, such components must not be understood as being limited to the above terms. The above terms are used only to distinguish one component from another. Thus, the components are not limited by the terms.

Figure 2A:
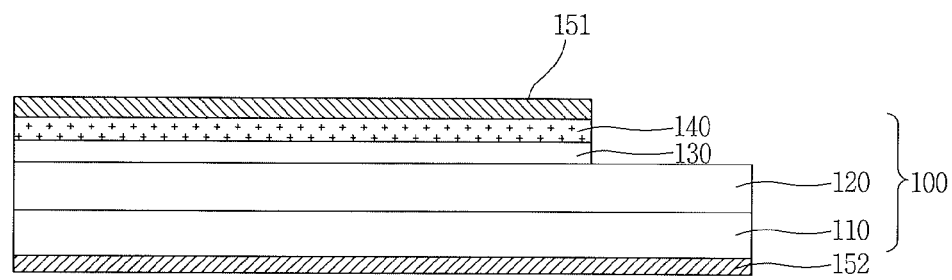
FIG. 2A is a cross-sectional view of a flat panel display device according to a first embodiment of the invention.
Figure 2B:
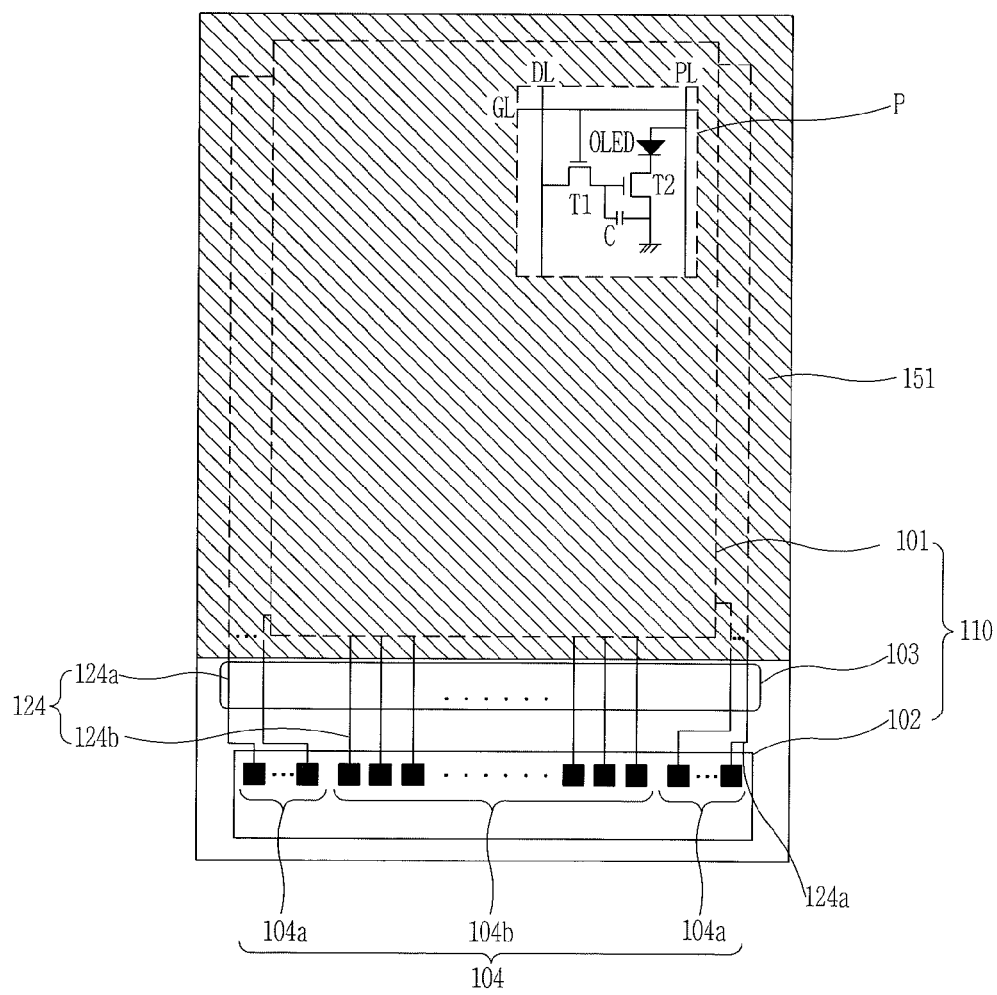
FIG. 2B is a schematic plan view of the flat panel display device according to the first embodiment of the invention.

FIG. 2A is a cross-sectional view of a flat panel display device according to a first embodiment of the invention, and FIG. 2B is a schematic plan view of the flat panel display device according to the first embodiment of the invention.

A flat panel display device as an organic light emitting display device according to the first embodiment of the invention includes a display panel 100 and a display panel driving unit. Referring to FIG. 2A, the display panel 100 includes a substrate 110, a thin film transistor (TFT) layer 120, an organic light emitting diode (OLED) layer 130, an adhesive layer 140, an upper film 151, and a lower film 152. The display panel driving unit includes a driving circuit formed in the TFT layer 120, and a printed circuit board (PCB). The PCB and the driving circuit may be connected by a flexible PCB (FPCB).

In case of an LCD, the display panel 100 may include a liquid crystal panel and a backlight unit, while in the instance of an organic light emitting display device, since an organic light emitting layer emits light, the organic light emitting display device does not have an additional light source. Hereinafter, in a first embodiment of the invention, it is assumed that the display panel 100 is an organic light emitting display panel.

The substrate 110 may be a glass substrate, an insulating substrate, or the like, and in an instance in which the organic light emitting display device is configured as a flexible display device, the substrate 110 may be a plastic substrate. The plastic substrate may be made of any one of polycarbon, polyimide, polyether sulfone (PES), polyarylate (PAR), polyethylene naphthalate (PEN), and polyethyleneterephthalate (PET). However, in an embodiment of the invention, the substrate 110 may be made of polyimide.

Here, referring to FIG. 2B, the substrate 110 may be defined by a display part 101, a driving circuit part 102, and a boundary part 103. The display part 101 is a region in which an image is displayed. The driving circuit part 102, being a portion other than the display part 101, is a region in which a driving circuit is formed. The boundary part 103 is a region between the display part 101 and the driving circuit.

The display part 101 includes a plurality of wirings and TFTs, the driving circuit part 102 includes a driving chip, a circuit wiring, and a pad part 104, and the boundary part 103 includes link lines 124 for connecting the driving circuit and the display part 101.

The plurality of wirings of the display part 101 include a gate line GL, a data line DL, a voltage supply line, and the like. The gate line GL and the data line DL are connected to a gate terminal and a source terminal of a TFT, respectively. Gate lines GL and data lines DL are formed vertically and horizontally to define a plurality of pixels P. The voltage supply line PL is connected to one end of an OLED.

The TFT of the display part 101 is formed in each pixel P. Each TFT is connected to the plurality of wirings to control an operation of the OLED. In this instance, a plurality of TFTs are formed to serve as a switch or control an amount of a current.

As shown in FIG. 2B, the driving circuit part 102 may be formed in the display panel 101 in a chip on glass (COG) manner, or may be formed outside of the display panel 100 in a tape carrier package (TCP) manner.

Here, the pad part 104 is an electrode to be connected to the FPCB so as to be connected to the PCB. The pad part 104, serving as a medium for transferring driving signals to the gate lines GL and the data lines DL, respectively, includes a gate pad 104a for transferring a gate signal to the gate line GL and a data pad 104b for transferring a data signal to the data line DL. In the first embodiment of the invention, the driving circuit part 102 may be formed at one side, and the gate lines GL may be connected to gate pads 104a formed at both sides of the driving circuit part 102. The data pad 104b may be formed between the gate pads 104a.

The link lines 124 formed in the boundary part 103 serve to connect the plurality of wirings of the display part 101 and the pad part 104 of the driving circuit. In detail, the link lines 124 include first link lines 124a connecting the gate line and the gate pad 104a and second link lines 124b connecting the data line and the data pad 104b. The first link lines 124a may be formed at both sides of the second link lines 124b.

Here, it is described that the first embodiment of the invention has the structure in which the driving circuit is formed at one side and the first link lines 124a are disposed at both sides of the second link lines 124b, but when the driving circuit is formed in at least to sides of the display part 101 or when the driving circuit is formed according to a TCP method, the first embodiment may have a different layout structure.

The OLED layer 130 is formed on the display part 101 of the TFT layer 120. The OLED layer 130 includes an LED having a first electrode, an organic light emitting layer, and a second electrode.

In this instance, each pixel of the display panel 100 may include a first transistor T1 having a gate terminal connected to the gate line GL and a drain terminal connected to the data line DL, a second transistor T2 having a gate terminal connected to a source terminal of the first transistor T1, a drain terminal connected to a cathode of the OLED, and a source terminal connected to a ground terminal, a capacitor C connected between the gate terminal of the second transistor T2 and the source terminal of the second transistor, and the OLED having an anode terminal connected to the voltage supply line PL, a cathode terminal connected to the drain terminal of the second transistor T2.

Here, the first transistor T1 is turned on in response to a scan signal from the gate line GL so as to form a current path between the source terminal thereof and the drain terminal thereof, and when a voltage in the gate line GL is lower than a threshold voltage Vth of the first transistor T1, the first transistor T1 is maintained in a turned-off state. During a turned-on time period of the first transistor T1, a data voltage from the data line DL is applied to the gate terminal of the second transistor T2 through the drain terminal of the first transistor T1.

The second transistor T2 adjusts an amount of a current flowing between the source terminal thereof and the drain terminal thereof according to the data voltage supplied to the gate terminal thereof to turn on the OLED to have brightness corresponding to the data voltage.

Here, the capacitor C uniformly maintains the data voltage applied to the gate terminal of the second transistor R2 during one frame period, and uniformly maintains the current applied to the OLED during one frame period.

Subsequently, the adhesive layer 140 is formed on the OLED layer 130 to encapsulate the substrate 110, and prevent the OLED from being exposed to the outside to thus prevent a foreign object from being inserted thereto.

However, the first embodiment of the invention is not limited thereto and may further include another substrate encapsulating the display part 101 instead of the adhesive layer 140. In this instance, the substrate 110 may include a moisture absorbent, or the like.

The upper film 151 is attached to an upper portion of the adhesive layer 140, and the lower film 152 may be attached to a lower portion of the substrate 110. The upper film 151 may be formed to have an area substantially equal to that of the adhesive layer 140 to cover the display part 101, and the lower film 152 is formed to have an area substantially equal to that of the lower surface of the substrate 110. In this instance, the upper film 151 and the lower film 152 may be protective films for protecting the display panel 100 or polarizer films for polarizing light emitted from the display panel 100.

Meanwhile, the upper film 151 is originally fabricated to have a size larger than the entire area of the display panel 100, but since the region corresponding to the driving circuit unit 102 is opened through a cutting process, the upper film 151 is formed to have an area equal to that of the adhesive layer 140. In this instance, in order to prevent the display panel 100 from being damaged by a laser during a cutting process, a protective pattern 161 may be formed in one region of a lower portion of the upper film 151. As shown in FIG. 3D, for example, the protective pattern 161 may remain on the lower surface of the upper film 151 after the cutting process is performed, or may be removed through etching after the cutting process is performed.

Hereinafter, a method of fabricating a flat panel display device including the cutting process according to the first embodiment of the invention will be described in detail.

FIGS. 3A to 3F are cross-sectional views illustrating a process of fabricating the flat panel display device according to the first embodiment of the invention, and FIGS. 4A to 4F are plan views illustrating a process of fabricating the flat panel display device according to the first embodiment of the invention.

Figure 3A:
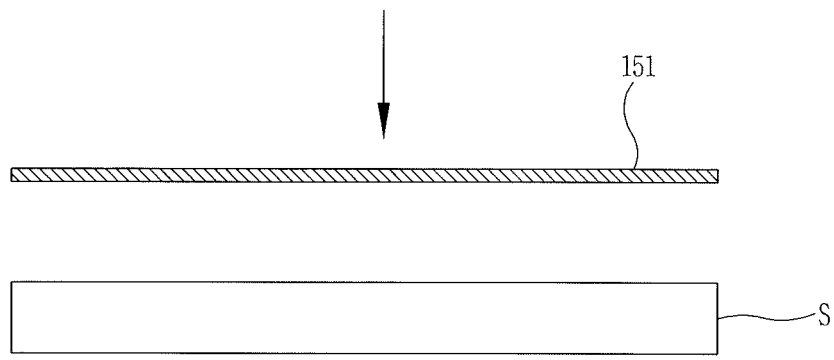
FIGS. 3A to 3F are cross-sectional views illustrating a process of fabricating the flat panel display device according to the first embodiment of the invention.
Figure 4A:
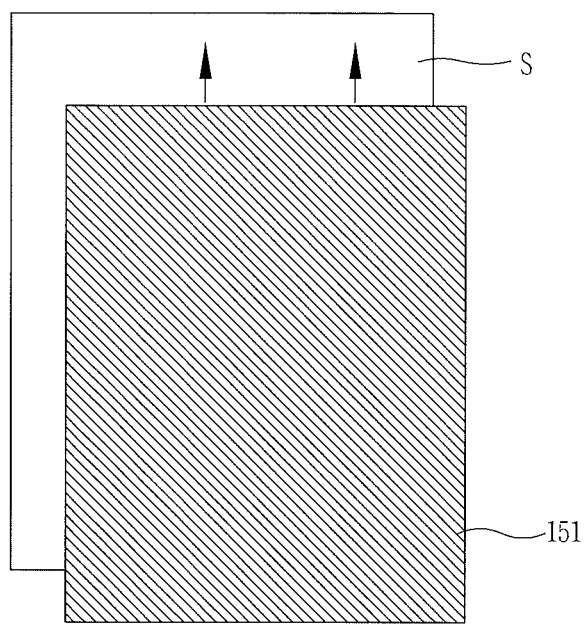
FIGS. 4A to 4F are plan views illustrating a process of fabricating the flat panel display device according to the first embodiment of the invention.

First, as illustrated in FIGS. 3A and 4A, the upper film 151 is attached to a base substrate S. The base substrate S may be a glass substrate, a metal substrate, an insulating substrate, or the like. The base substrate S is a substrate 110 prepared to form the protective pattern 161 on the upper film 151. The base substrate S and the upper film 151 may be attached by using an adhesive.

Figure 3B:
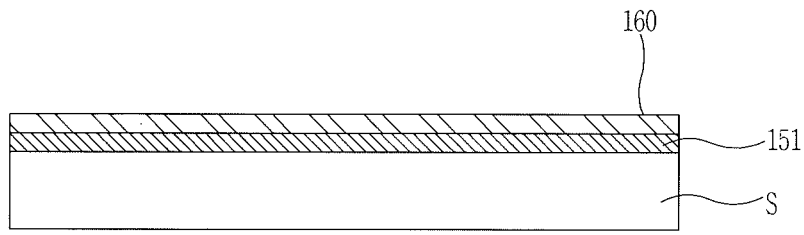
Figure 4B:
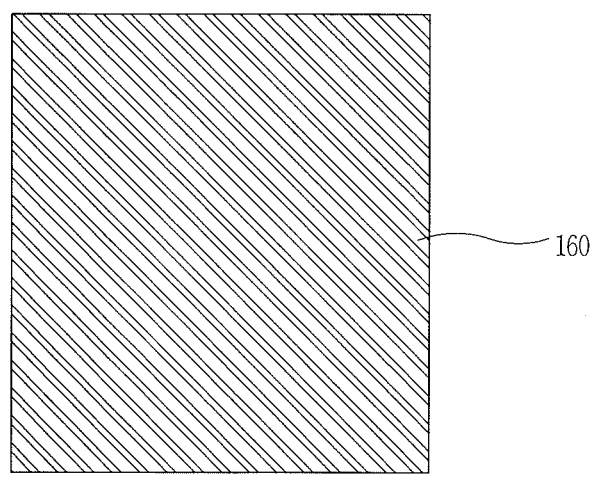

Next, as illustrated in FIGS. 3B and 4B, the metal layer 160 may be deposited on the upper film 151. The metal layer 160 may be made of metal having reflective qualities resistant to a laser. The metal layer 160 may be formed through sputtering, chemical vapor deposition (CVD), or the like.

Figure 3C:
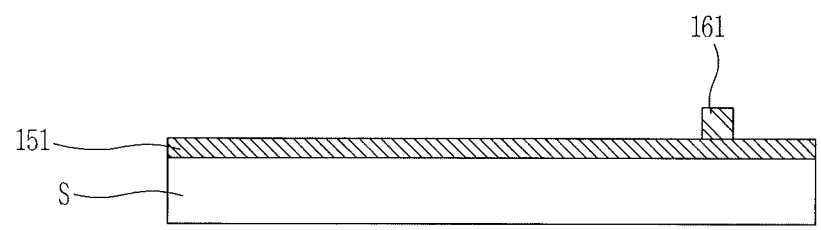
Figure 3D:
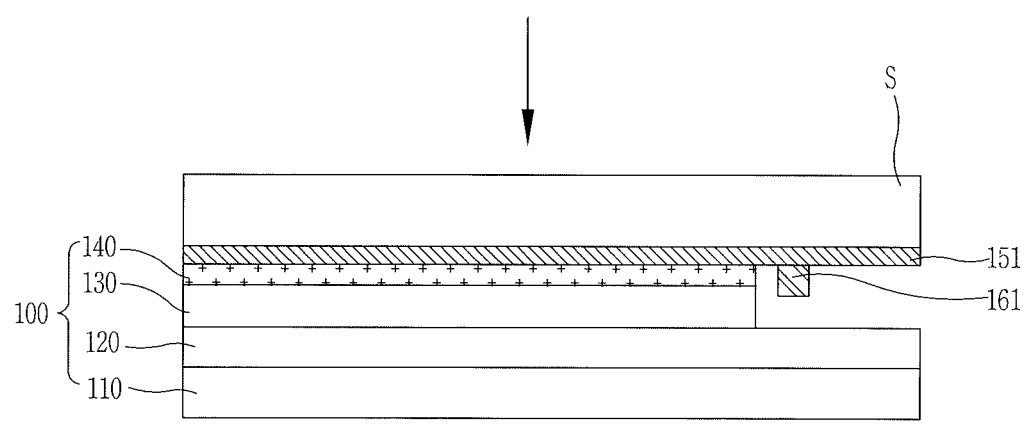
Figure 4C:
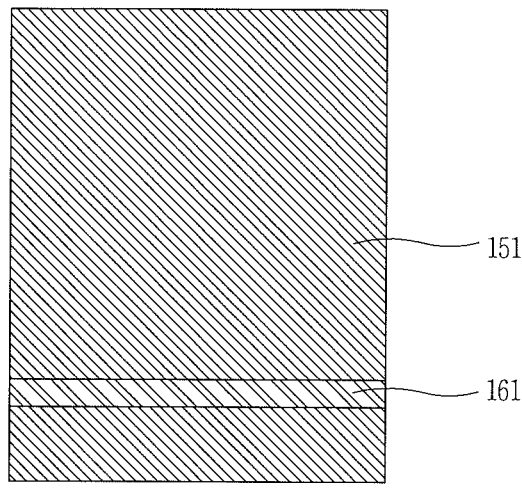

Subsequently, as illustrated in FIGS. 3C and 4C, the metal layer 160 is patterned through a masking process to form the protective pattern 161. The protective pattern 161 may be formed as a single pattern and may be formed to face in one direction. As for a position of the protective pattern 161, the protective pattern 161 may be formed at a position facing a boundary region of the display panel 100 when the upper film 151 is attached to the display panel 100.

Figure 4D:
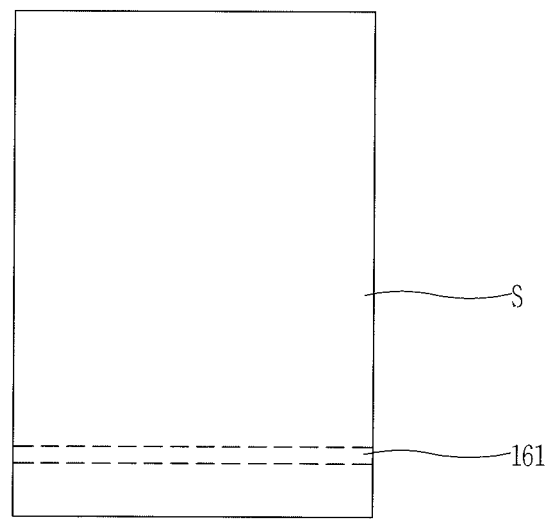

As illustrated in FIGS. 3D and 4D, the base substrate S with the protective pattern 161 formed thereon is attached in a facing manner to an upper portion of the display panel 100. In this instance, the display panel 100 may include only the substrate 110, the TFT layer 120, the OLED layer 130, and the adhesive layer 140, and the adhesive layer 140 and the OLED layer 130 are formed in the display part as mentioned above.

Here, due to an adhesive component of the adhesive layer 140, the upper film 151 is easily attached to the display panel 100. In this instance, when the upper film 151 is attached, preferably, but not necessarily, the protective pattern 161 is disposed at a position overlapped with the boundary region of the display panel 100.

Figure 3E:
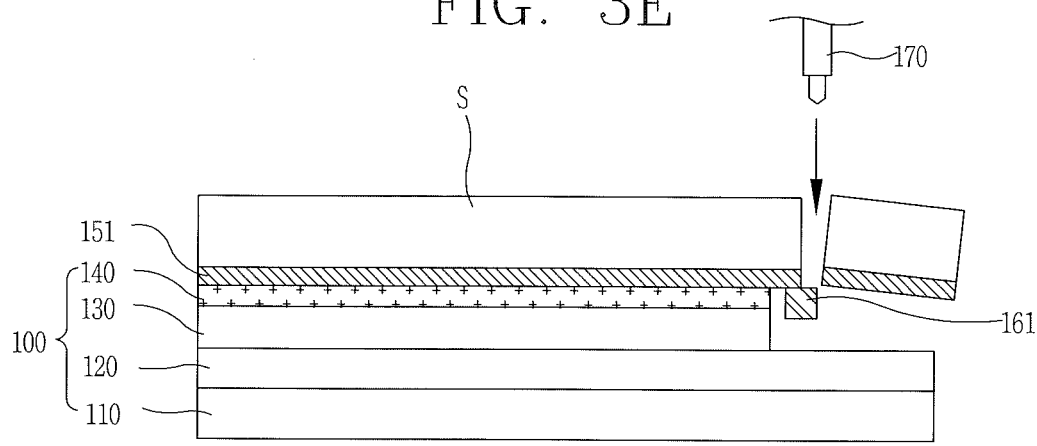
Figure 4E:
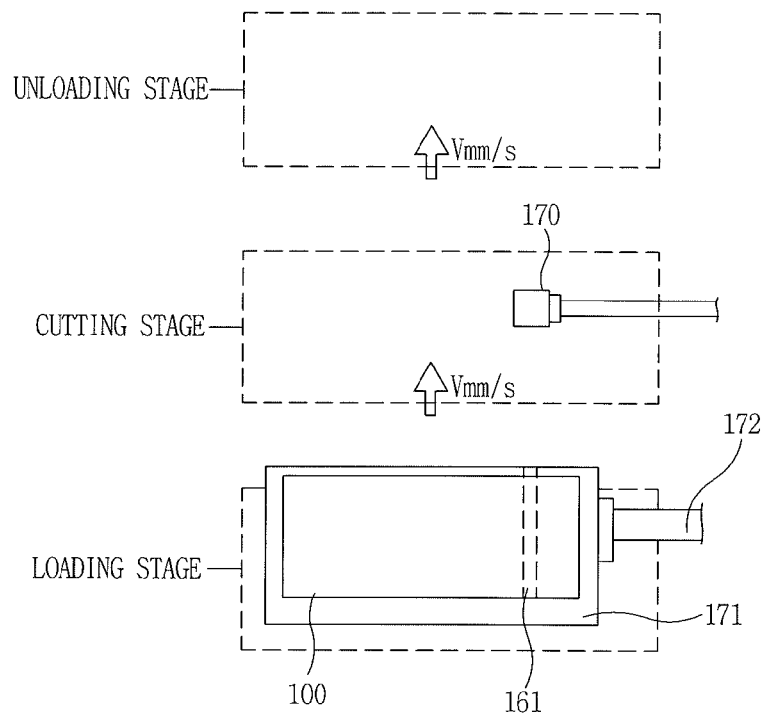

Thereafter, as illustrated in FIGS. 3E and 4E, the base substrate S is removed through etching, and the upper film 151 is cut.

The base substrate S may be removed through wet etching, dry etching, or the like.

During a process of cutting the upper film 151, the display panel 100 with the upper film 151 attached thereto is loaded to a loading stage, carried to a cutting stage in which a laser unit 170 is disposed, and cut, and subsequently unloaded to an unloading stage.

First, in order to move the display panel 100, a transfer substrate 171 and a transfer arm 172 are disposed, and the display panel 100 is loaded to an upper portion of the transfer substrate 171.

The transfer substrate 171 has a constant speed v and passes a lower portion of the fixed laser unit 170. The laser unit 170 may use a $CO_2$ laser, a UV laser, an excimer laser, a femto laser, and the like. In this instance, the laser unit 170 is disposed above the display panel 100 and is shooting a laser beam downwardly. The region to which a laser beam is shot is an upper side of a region in which the protective pattern 161 is formed.

Thus, when the display panel 100 is first loaded, the display panel 100 is required to be loaded such that the position of the laser unit 170 and a disposition position of the protective pattern 161 correspond to each other. When the display panel 100 passes at a constant speed (v) below the laser unit 170, the base substrate S and the upper film 151 are cut. The moment the upper film 151 is cut, a laser beam proceeding downwardly from the upper film 151 is reflected by the protective film 161, so the link lines formed in the boundary part of the display panel 100 may not be damaged.

Here, a principle of cutting the upper film 151 with a laser is damaging bonding between molecules of the upper film 151 by applying energy to one region of the upper film 151 through a laser. Thus, in order to cut the upper film 151, appropriate energy is required, and appropriate energy is determined by a time during which a laser beam is shot. Namely, a time for shooting a laser beam varies according to a speed at which the transfer substrate 171 is moved, so the moving speed of the transfer substrate 171 is also an important factor for attaining perfect cutting.

Thus, the method of fabricating a flat panel display device according to the first embodiment of the invention includes an instance in which a moving speed of the transfer substrate 171 ranges from 285 mm/s to 295 mm/s when power of a laser beam is set as 13.5 W. When the moving speed of the transfer substrate 171 is lower than 285 mm/s, excessively high energy is supplied to damage the boundary region of the display panel 100, and when the moving speed of the transfer substrate 171 is higher than 295 mm/s, excessively low energy is supplied to incompletely cut the upper film 151.

Figure 3F:
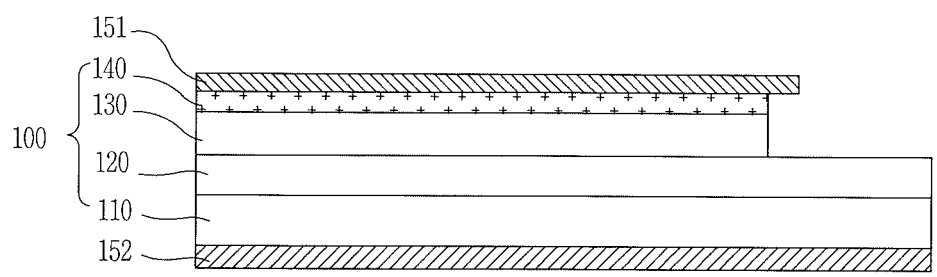
Figure 4F:
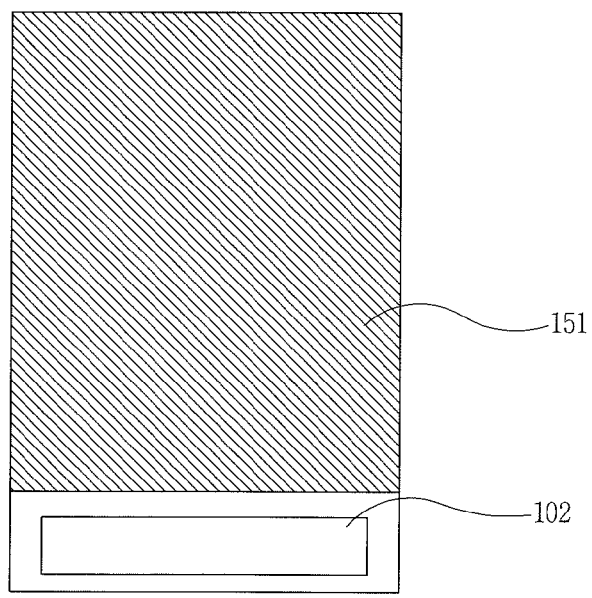

Subsequently, as illustrated in FIGS. 3F and 4F, the separated upper film 151 may be removed, and the lower film 152 may be attached. After the cutting, a portion of the protective pattern 161 remains on the upper film 151 attached to the display panel 100, and in this instance, it may be removed through etching. As a result, the display panel 100 is configured such that the driving circuit part 102 is exposed through the cutting of the upper film 151.

The lower film 152 may be attached to a lower surface of the display panel 100 in order to protect the display panel 100. Thereafter, the display panel 100 may undergo a module process so that the PCB and the driving circuit may be connected by the FPCB. Meanwhile, a cutting process has been described on the basis of the single display panel 100, but the first embodiment of the invention includes an instance in which a cutting process is performed on a plurality of display panels 100 formed on a mother substrate 105.

Figure 5:
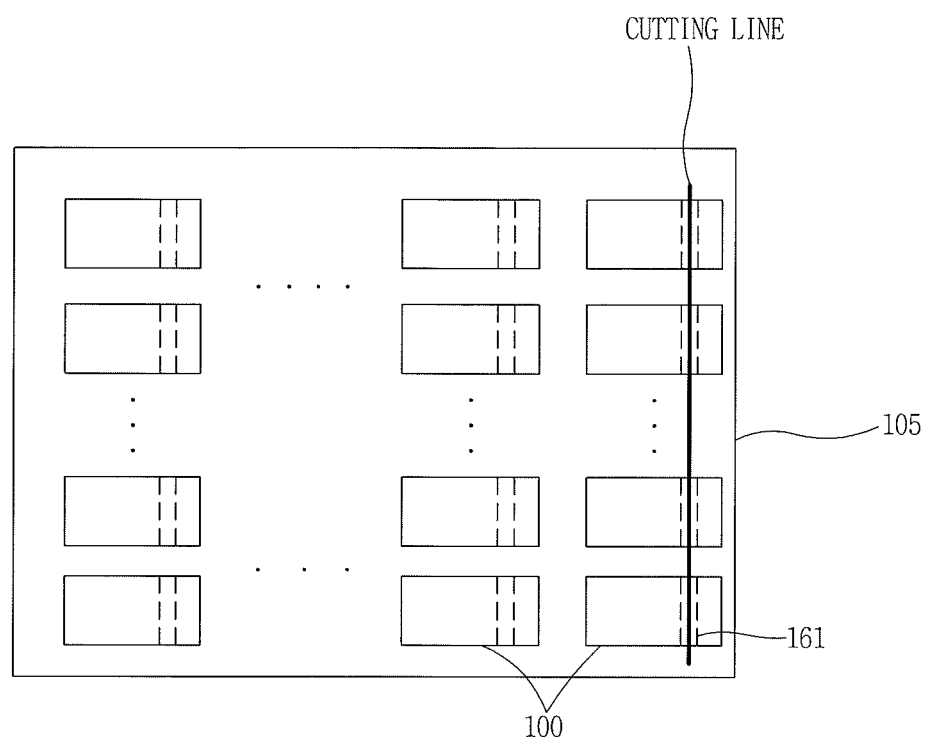
FIG. 5 is a plan view illustrating a mother substrate used for a cutting process according to the first embodiment of the invention.

FIG. 5 is a plan view illustrating a mother substrate used for a cutting process of the method of fabricating a flat panel display device according to the first embodiment of the invention.

The mother substrate 105 includes a plurality of display panels 100. The plurality of display panels 100 include the protective pattern 161 formed at the same position, respectively. The protective patterns 161 are formed at the same position with respect to one row. Thus, a cutting line may be defined in one direction. A plurality of upper films may be cut by a single cutting.

Hereinafter, a flat panel display device and a method of fabricating a flat panel display device according to a second embodiment of the invention will be described in detail.

Figure 6:
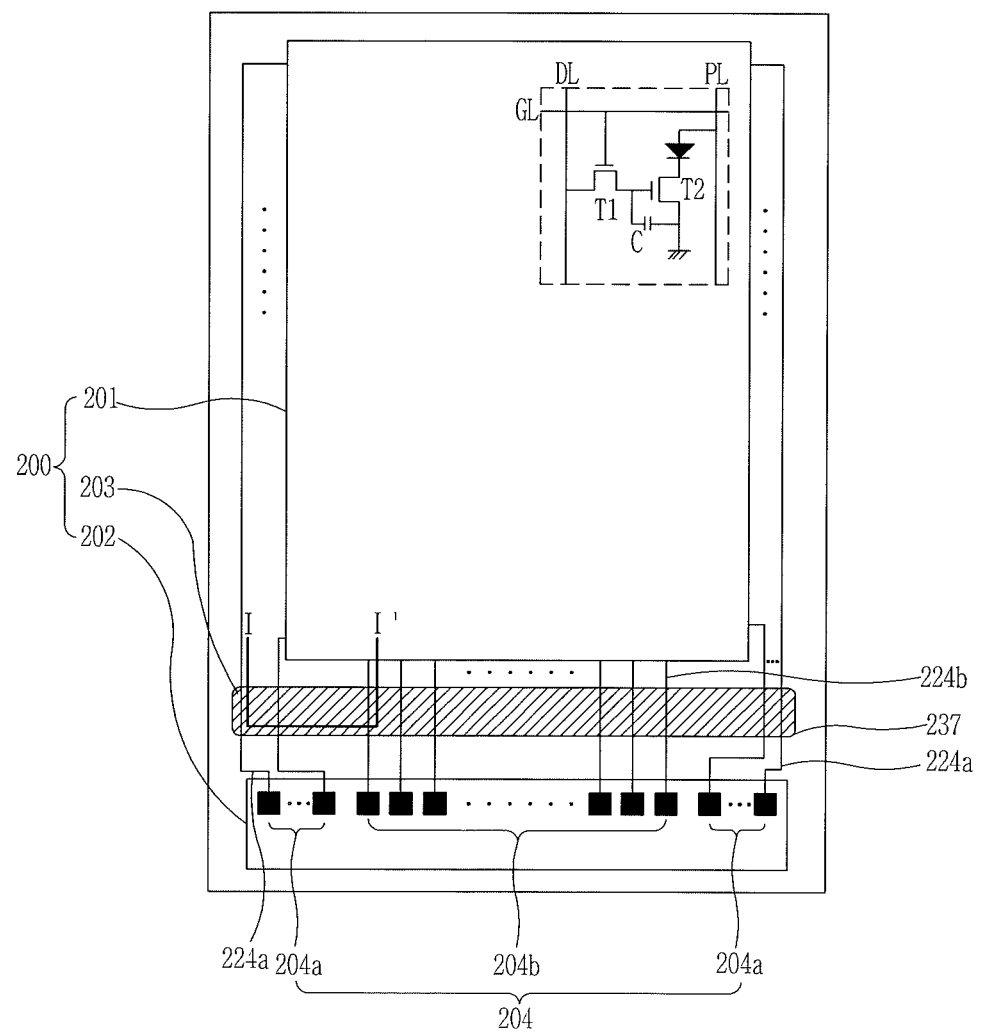
FIG. 6 is a schematic plan view of a flat panel display device according to a second embodiment of the invention.

FIG. 6 is a schematic plan view of a flat panel display device according to a second embodiment of the invention. In this instance, FIG. 6 illustrates a state in which an upper film is not attached.

Unlike the first embodiment in which the protective pattern is formed on the lower surface of the upper film, the second embodiment features that a protective pattern 237 is formed on a display panel 200.

The display panel 200 is divided into a display part 201, a driving circuit part 202, and a boundary part 203, and a protective pattern 237 is formed in the boundary part 203 of the display panel 200. In this instance, a cutting region is an upper portion of the boundary portion 203, and the moment the upper film is cut, the protective pattern 237 serves to absorb and block a laser beam at a lower side of the upper pattern, preventing damage that may be generated in link lines 224a and 224b.

Hereinafter, components not mentioned in the second embodiment of the invention are the same as those of the first embodiment, so a description thereof is replaced by that of the first embodiment. For example, reference numeral 204 is the same as the pad part 104 of the first embodiment.

Here, a method of fabricating a flat panel display device according to the second embodiment of the invention will be described in detail. FIGS. 7A to 7H are cross-sectional views illustrating a process of fabricating a display part and a boundary part of the flat panel display device according to the second embodiment of the invention, and FIGS. 8A to 8H are plan views illustrating a process of fabricating the boundary part of the flat panel display device according to the second embodiment of the invention.

Figure 7A:
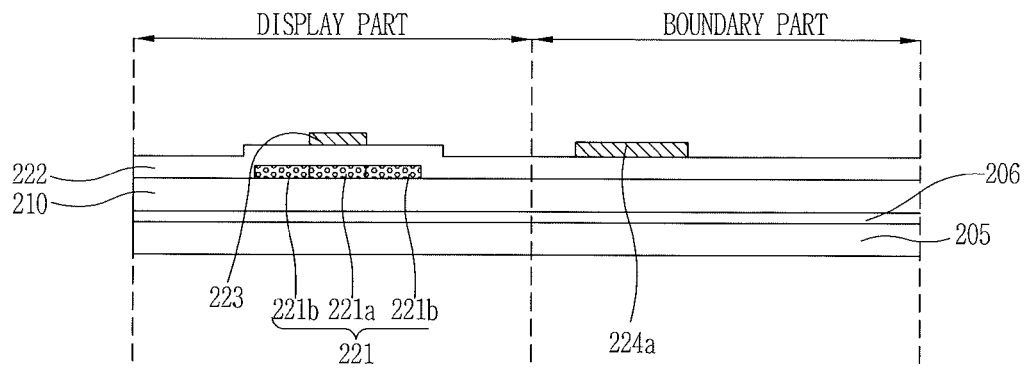
FIGS. 7A to 7H are cross-sectional views illustrating a process of fabricating a display part and a boundary part of the flat panel display device according to the second embodiment of the invention.

As illustrated in FIG. 7A, a substrate 210 is attached to an upper portion of the mother substrate 205, a semiconductor layer 221, a gate electrode 223, and a gate line are formed in the display part, first link lines 224a are formed in the boundary part, and a gate pad is formed in the driving circuit part.

The mother substrate 205 is a substrate as a base for forming a plurality of display panels. The mother substrate 205 may be made of glass, metal, or the like. In this instance, an adhesive 206 is applied to an upper portion of the mother substrate 205 to attach the substrate 210 and the mother substrate 205.

The semiconductor layer 221 is formed on the substrate 210, and in this instance, the semiconductor layer 221 includes an active layer 221a made of, for example, a silicon semiconductor and an ohmic-contact layer 221b doped with an n-type or p-type impurity. Meanwhile, the semiconductor layer 221 may be made of an oxide semiconductor.

Thereafter, a first insulating layer 222 is formed on the entire surface of the substrate 210, and a gate electrode 223 and a gate line, first link lines 224a, and a gate pad are formed in a region overlapping with the semiconductor layer 221 on an upper portion of the first insulating layer 222.

Figure 7B:
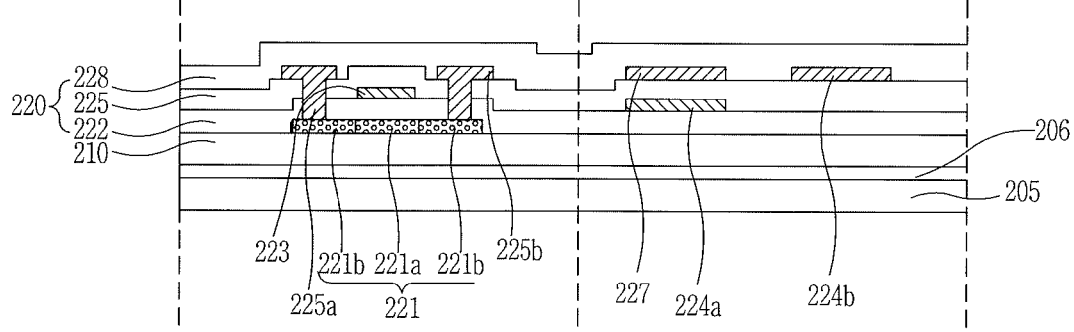
Figure 8A:
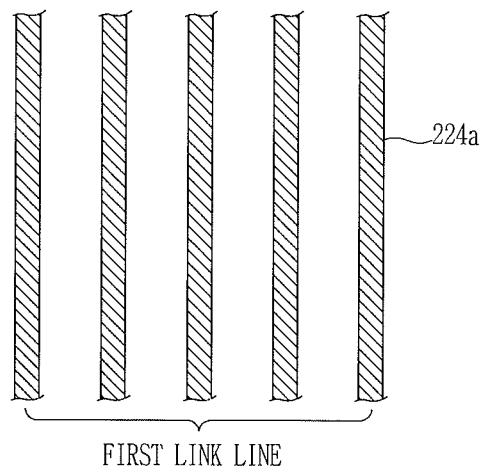
FIGS. 8A to 8H are plan views illustrating a process of fabricating the boundary part of the flat panel display device according to the second embodiment of the invention.
Figure 8B:
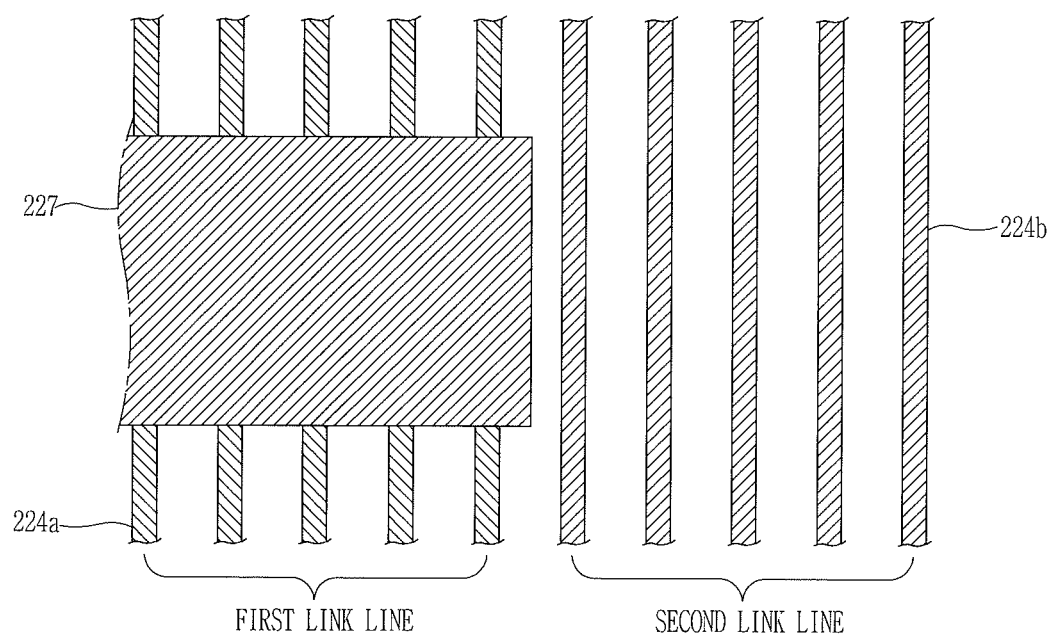

Subsequently, as illustrated in FIGS. 7B and 8B, a second insulating layer 225 is formed, source and drain electrodes 225a and 225b and a data line are formed in the display part, second link lines 224b and an auxiliary protective pattern 227 are formed in the boundary part, and a data pad is formed in the driving circuit part.

The second insulating layer 225 is formed on the entire surface of the substrate 210 in order to insulate the source and drain electrodes 225a and 225b and the gate electrode 223. Thereafter, source and drain electrodes 225a and 225b, data lines, second link lines 224b, an auxiliary protective pattern 227, and a data pad are formed on upper portions of the second insulating layer 225 through the same masking process. The auxiliary protective pattern 227 may be made of the same opaque metal as that of the material used to form the source and drain electrodes 225a and 225b.

Referring to FIG. 8B, the auxiliary protective pattern 227 may be formed as a single pattern in one region overlapping with the first link lines 224a. There is no limitation in a shape of the single pattern, and the auxiliary protective pattern 227 may extend in one direction.

Figure 7C:
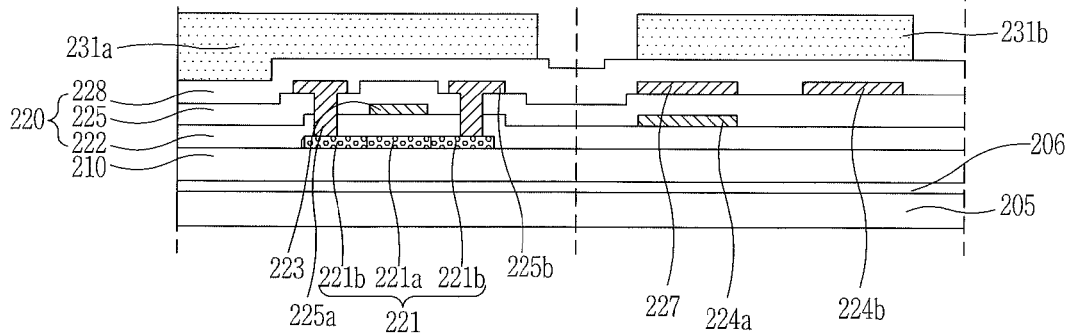
Figure 8C:
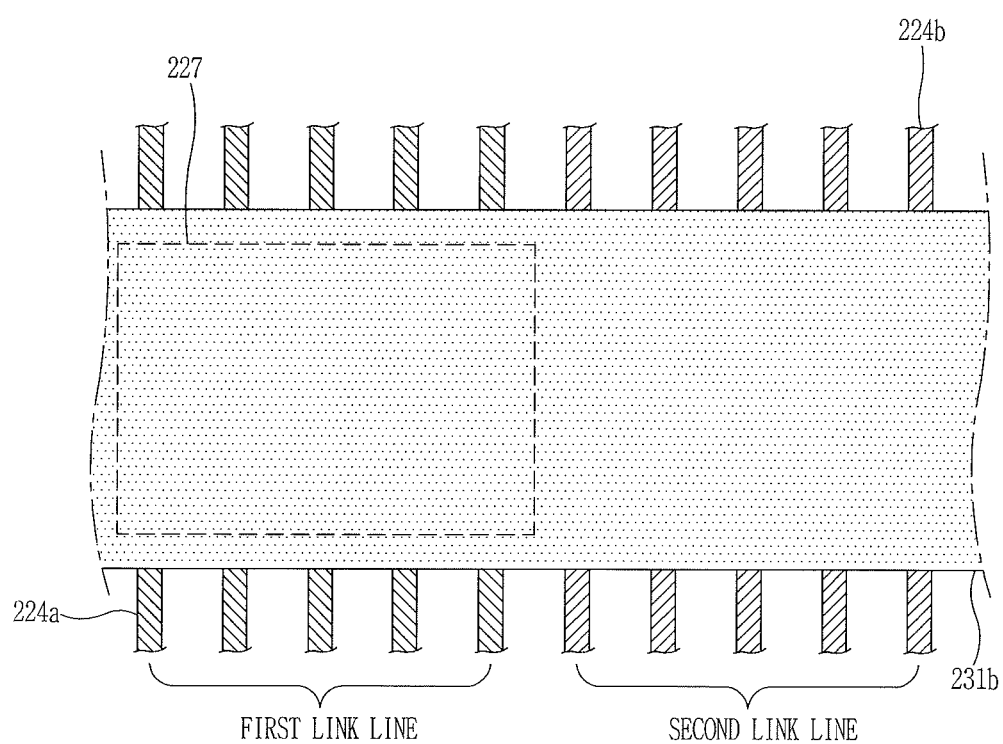

Subsequently, as illustrated in FIGS. 7C and 8C, after a third insulating layer 228 is formed, a polarization layer 231a is formed in the display part and a first protective layer 231b is formed in the boundary part.

The third insulating layer 228 is formed on the entire surface of the substrate 210 in order to protect the elements such as the source and drain electrodes 225a and 225b, the data line, and the like. In this instance, a contact hole may be formed in the driving circuit part in order to allow the gate pad and the data pad to be exposed therethrough, and a connection pattern may be formed to be in contact with the gate pad and the data pad through the contact hole. In this manner, as the third insulating layer 228 is formed, the formation of a TFT layer (or a TFT layer structure) 220 is completed.

Thereafter, the planarization layer 231a and the first protective layer 231b may be formed through a first masking process. The first masking process refers to a process including sequential processes such as a deposition process, an exposing process, a developing process, an etching process, and the like. In this instance, the planarization layer 231a and the first protective layer 231b may be made of an organic substance such as photo acryl, poly vinyl alcohol (PVA), or benzocyclobutene (BCB) or an inorganic substance such as silicon oxide film (SiO$_2$) or a silicon nitride film (SiNx).

The planarization layer 231a is formed to eliminate influence caused by a step formed in the TFT layer 220. The first protective layer 231b is formed to protect the first link lines 224a during a cutting process as described hereinafter. In this instance, the first protective layer 231b may be formed to cover the entirety of the first and second link lines 224a and 224b as illustrated in FIG. 8C. Also, the first protective layer 231b may be formed to cover the auxiliary protective pattern 227.

Figure 7D:
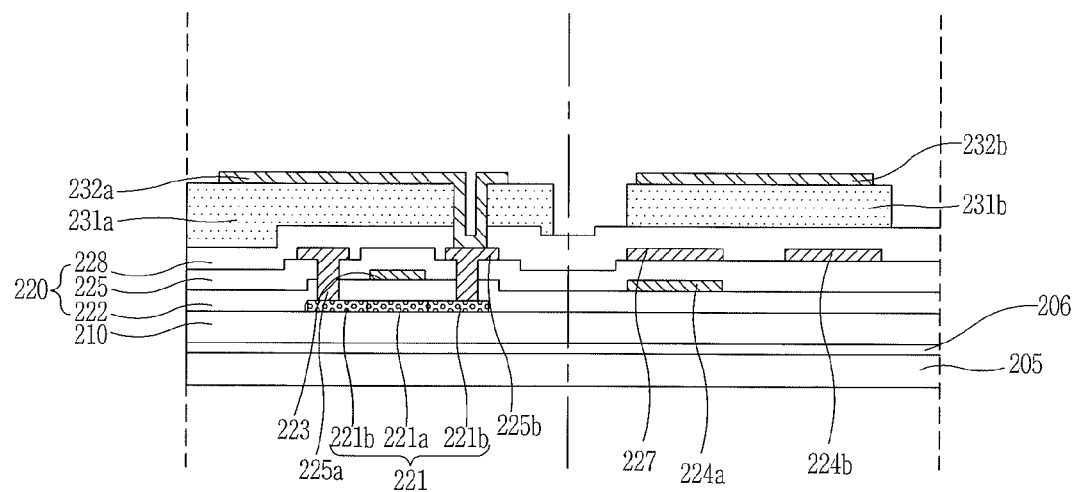
Figure 8D:
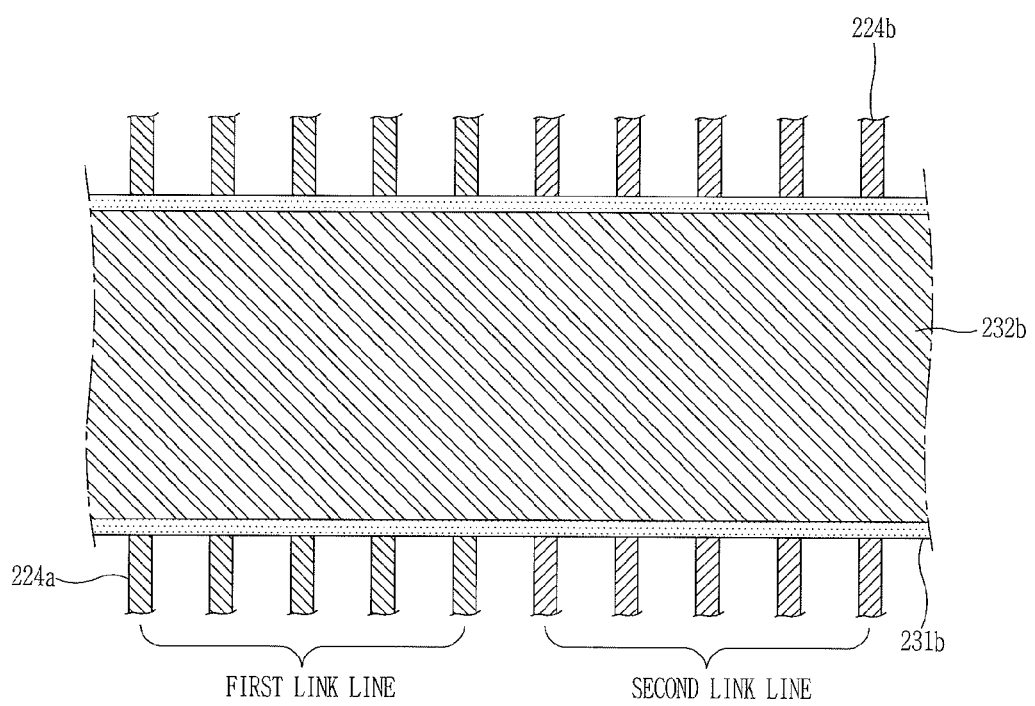

As illustrated in FIGS. 7D and 8D, a first electrode 232a may be formed on an upper portion of the planarization layer 231a in the display part, and a second protective layer 232b may be formed on an upper portion of the first protective layer 231b in the boundary part.

In this instance, the first electrode 232a and the second protective layer 232b may be formed through a second masking process, and may be made of a transparent conductive material (e.g., indium tin oxide (ITO) or indium zinc oxide (IZO)) having a relatively high work function value.

The first electrode 232a is formed to be electrically connected to the drain electrode 225b through a contact hole formed to penetrate the planarization layer 231a and the third insulating layer 228. The contact hole is formed through a separate masking process. In this instance, the first electrode 232a may be an anode electrode.

The second protective layer 232b may be formed to overlap with the first protective layer 231b. In the drawing, the second protective layer 232b is formed to have an area smaller than that of the first protective layer 231b, but the embodiment of the invention is not necessarily limited thereto and the second protective layer 232b may be formed to have an area greater than or equal to that of the first protective layer 231b.

Figure 7E:
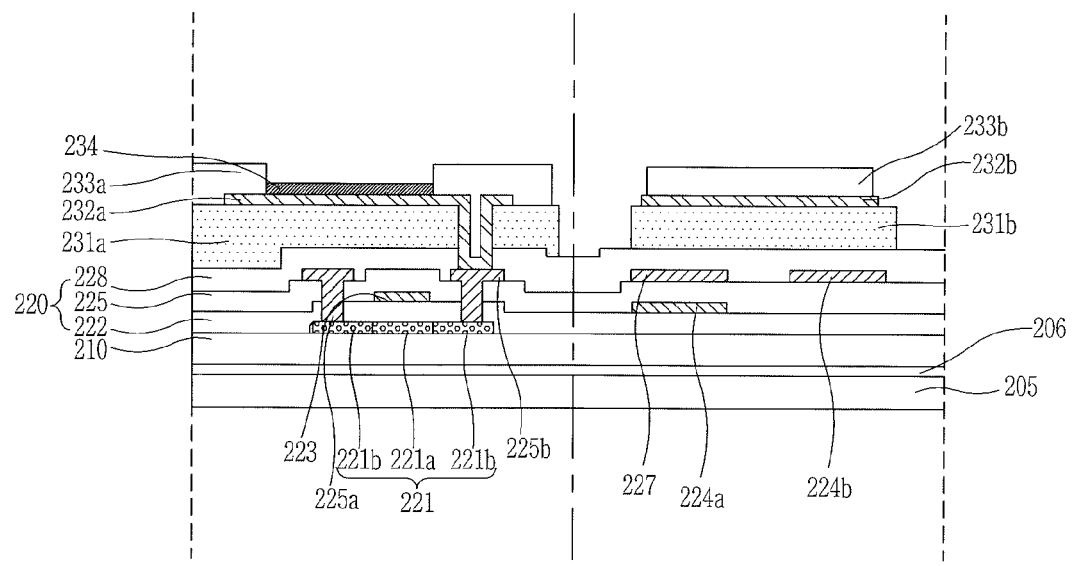
Figure 8E:
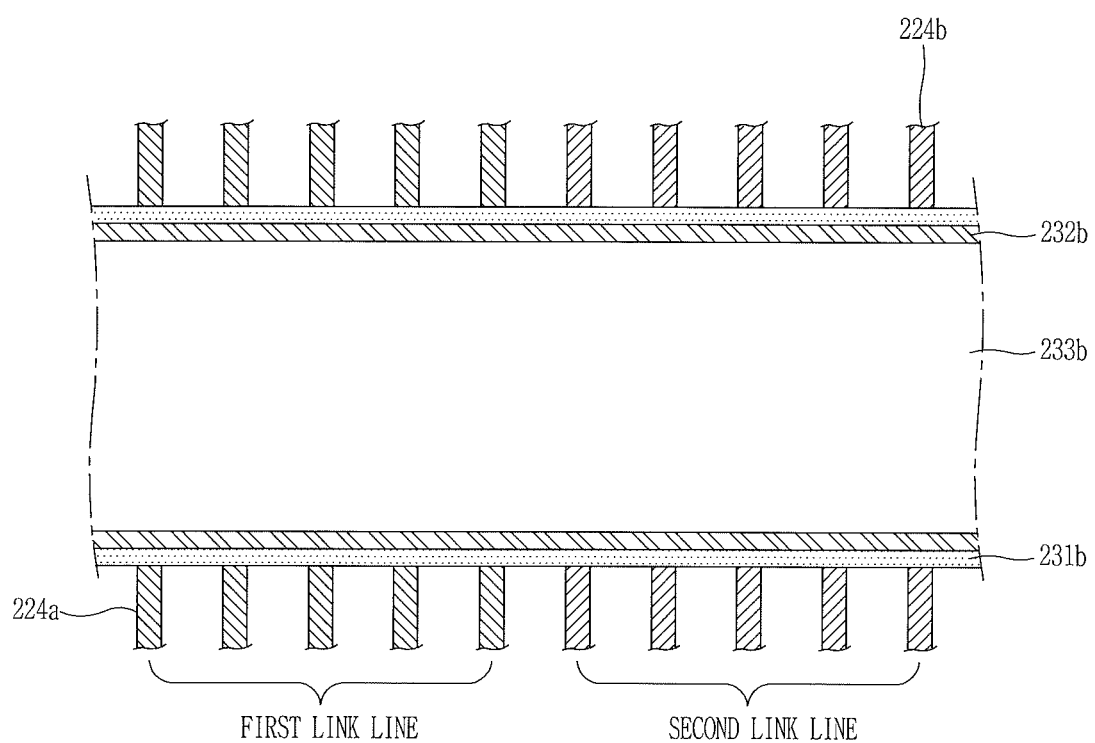

Thereafter, as illustrated in FIGS. 7E and 8E, a bank 233a, a spacer, and an organic light emitting layer 234 may be formed in the display part, and a third protective layer 233b may be formed in the boundary part.

First, the bank 233a, the spacer, and the third protective layer 233b may be formed through a third masking process. The bank 233a, the spacer, and the third protective layer 233b may be made of a polymer material among any one of polyimide, polyacryl, and polystyrene, or a silicon oxide film or a silicon nitride film.

The bank 233a is formed in a non-light emitting region in which a TFT, a gate line, and a data line are formed, and due to the presence of the bank 233a, an organic layer is not formed in an uneven surface, and thus, degradation of the organic layer is prevented.

A spacer having a columnar shape or a dam-like shape may be formed on an upper portion of the bank 233a. Meanwhile, in the second embodiment of the invention, a spacer may be omitted or may be formed together with the bank 233a.

The third protective layer 233b is formed on an upper portion of the second protective layer 232b. In the drawing, the third protective layer 233b is formed to have an area smaller than that of the second protective layer 232b, but the embodiment of the invention is not limited thereto and the third protective layer 233b may be formed to have an area equal to or greater than that of the second protective layer 232b.

Thereafter, an organic light emitting layer 234 is formed in a light emitting region at an upper portion of the first electrode 232a through a fourth masking process.

Figure 7F:
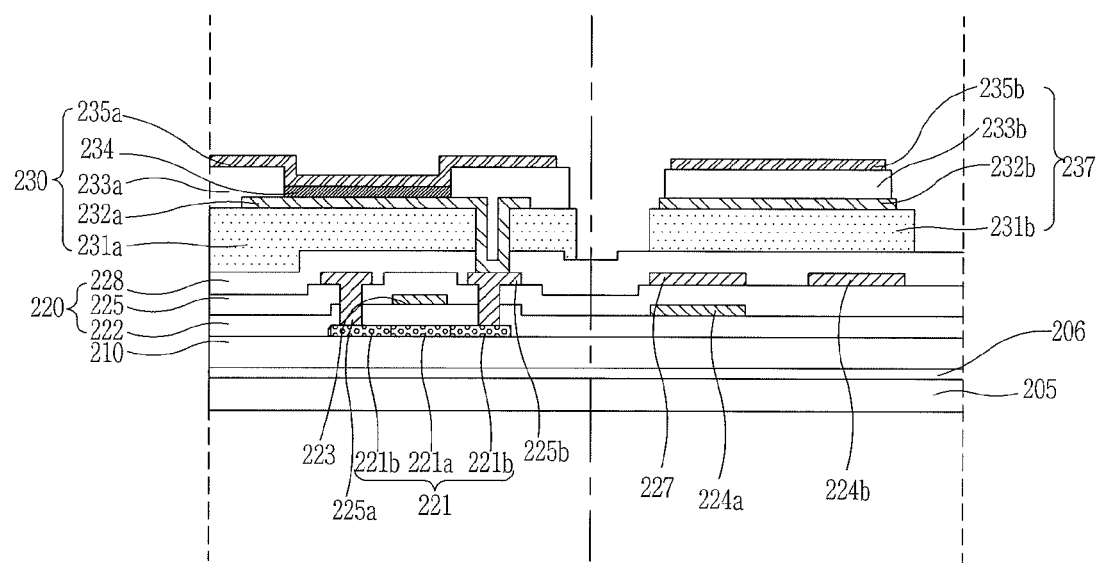
Figure 8F:
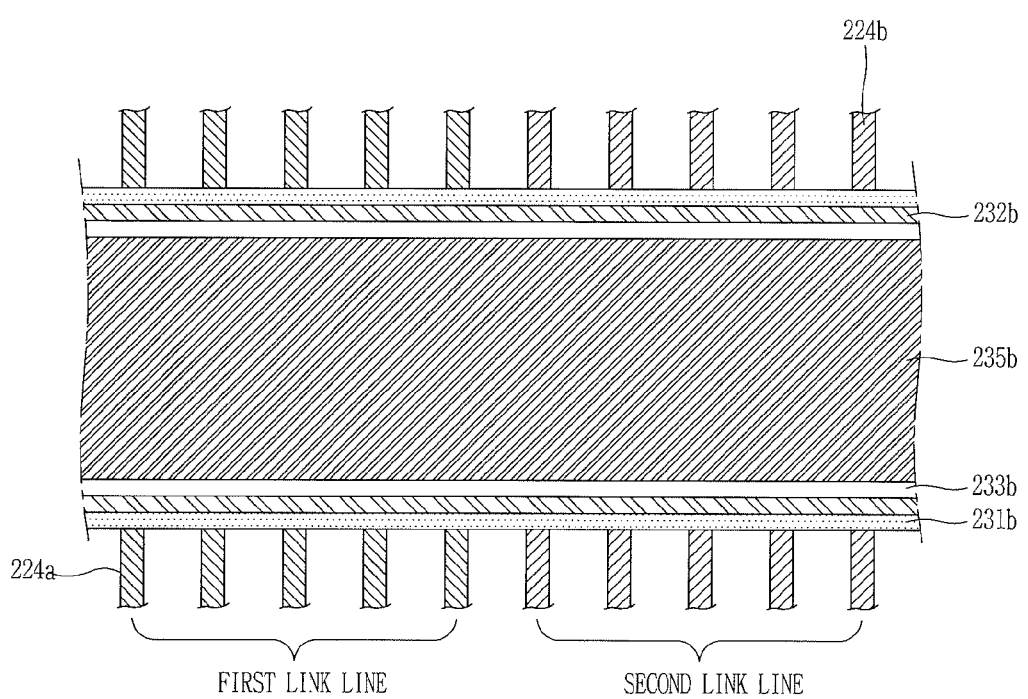

Thereafter, as illustrated in FIGS. 7F and 8F, a second electrode 235a may be formed in the display part, and a fourth protective layer 235b may be formed in the boundary part.

The second electrode 235a and the fourth protective layer 235b may be formed through a fifth masking process. In this instance, the second electrode 235a and the fourth protective layer 235b may be made of metal such as aluminum (Al), an aluminum alloy, silver (Ag), magnesium (Mg), or gold (Au), having a low work function value.

Here, the second electrode 235a serves as a cathode electrode, and constitutes an OLED together with the first electrode 232a and the organic light emitting layer. The organic light emitting layer 234 receives holes from the first electrode 232a and electrons from the second electrode 235a to generate excitons. An image is displayed by light emitted as the excitons are returned to ground state. Meanwhile, in the second embodiment of the invention, the OLED may be a top emission type OLED or a bottom emission type OLED. The planarization layer 231a, the planarization layer 231a, the first electrode 232a, the bank 233a, the organic light emitting layer 234 and second electrode 235a are elements of an OLED layer (or OLED layer structure) 230.

The fourth protective layer 235b is formed on an upper portion of the third protective layer 233b. In the drawing, the fourth protective layer 235b is formed to have an area smaller than that of the third protective layer 233b, but the embodiment of the invention is not limited thereto and the fourth protective layer 235b may be formed to have an area equal to or greater than that of the third protective layer 233b.

Here, the first to fourth protective layers 231b, 232b, 233b, and 235b may constitute a main protective pattern 237. The main protective pattern 237 may be formed in the boundary part of the display panel to protect the first and second link lines 224a and 224b from a cutting process.

Elements of the OLED layer 230 correspond to elements of the TFT layer 220, except for the organic light emitting layer 234. Thus, planarization layer 231a, the planarization layer 231a, the first electrode 232a, the bank 233a and second electrode 235a correspond to the first to fourth protective layers 231b, 232b, 233b and 235b, respectively.

Figure 7G:
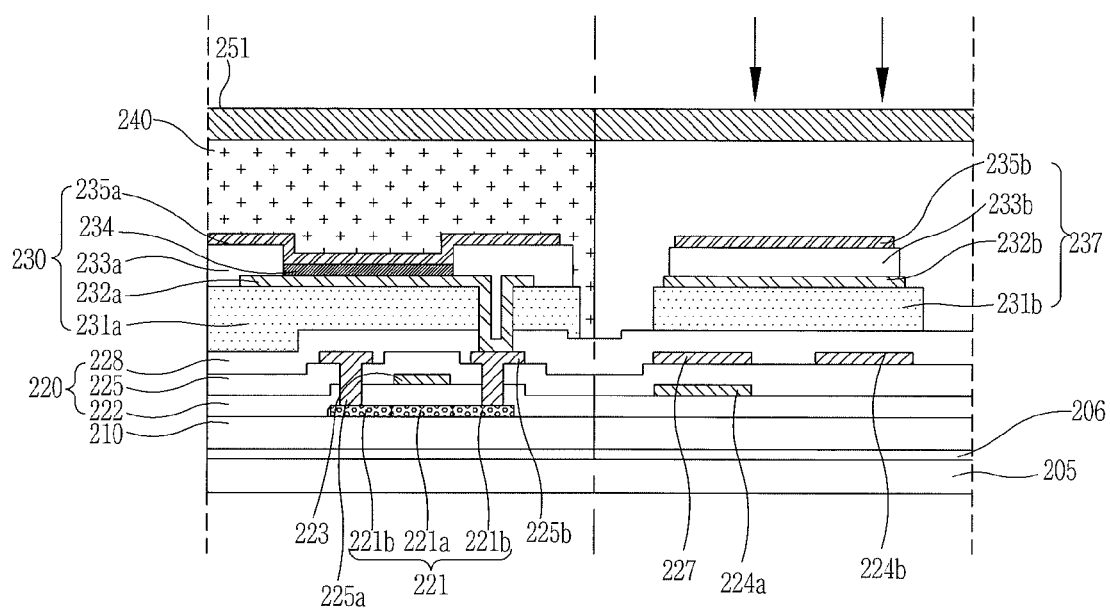
Figure 8G:
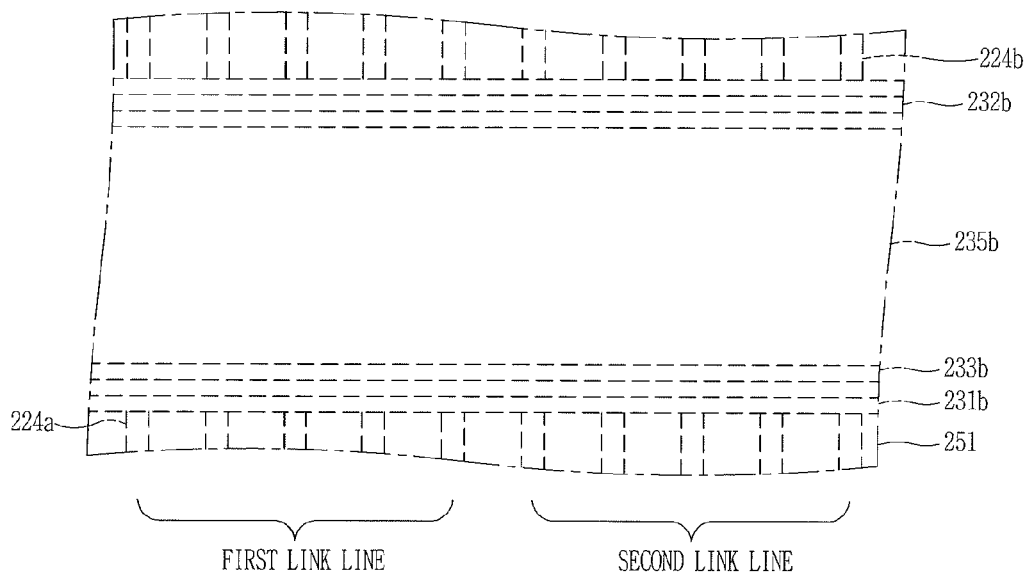

Subsequently, as illustrated in FIGS. 7G and 8G, an adhesive layer 240 is formed in the display part, and an upper film 251 is formed on an upper portion of a display panel.

The adhesive layer 240, made of a material having an adhesive component, serves to encapsulate the display panel. Meanwhile, in the second embodiment, a sealant may be applied to outer portions of the substrate 210 and, in this instance, a glass substrate may encapsulate the substrate 210 in a facing manner with the sealant interposed therebetween.

The upper film 251 is attached to the entire surface of the display panel, and in this instance, the upper film 251 may be easily attached to the display panel due to adhesive strength of the adhesive layer 240. In this instance, the upper film 251 may be a protective film for protecting the display panel or a polarizer film providing a polarization function.

A laser beam is shot to an upper portion of the upper film 251 in one direction. The laser beam is shot in order to remove a portion of the upper film 251 corresponding to the driving circuit part. This is because the driving circuit unit is required to be exposed so as to be connected to the PCB 210 during a module process. Thus, a laser beam is shot in one direction (or along one direction) as illustrated in FIG. 6. As for the laser beam shooting method, as discussed above in the first embodiment, the display panel may be moved with respect to a fixed laser unit, or the laser unit may be moved with respect to a fixed display panel.

In this instance, a region to which a laser beam is shot may be a region in which the main protective pattern 237 is formed.

Figure 7H:
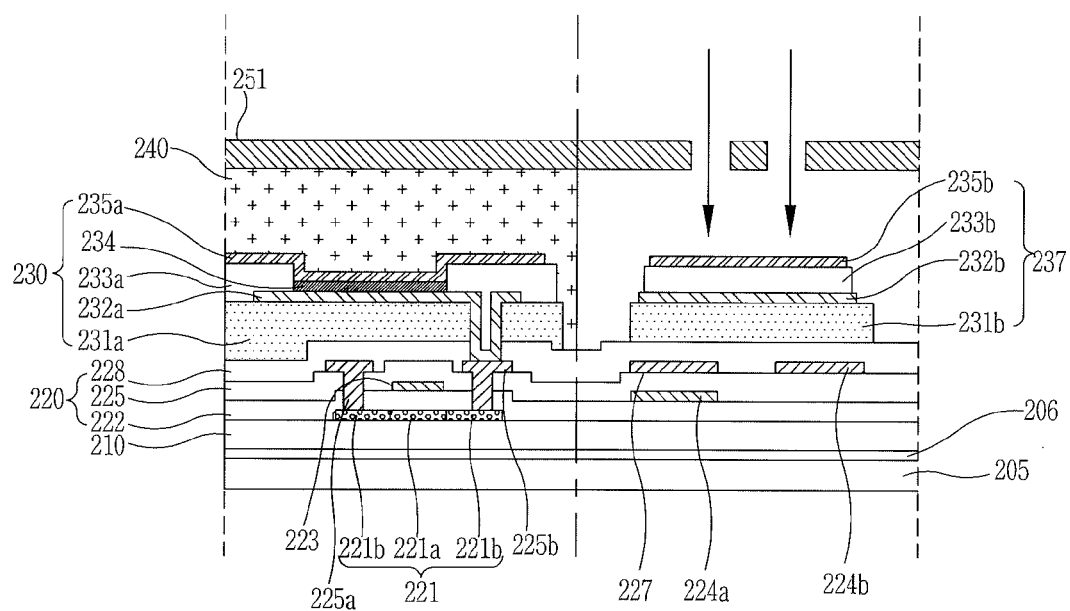
Figure 8H:
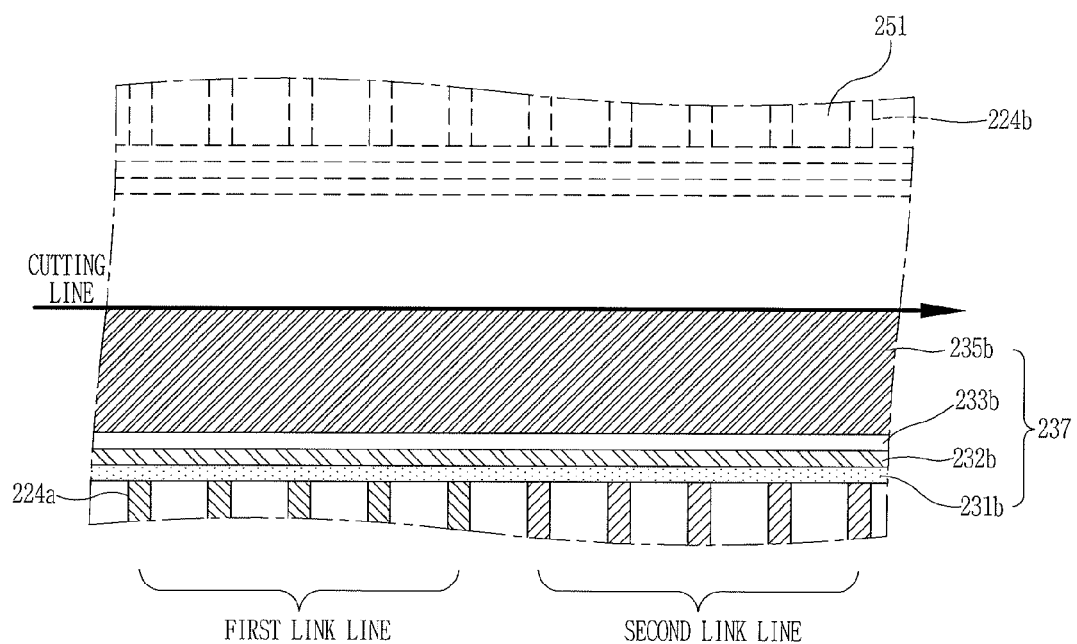

As a result, as illustrated in FIGS. 7H and 8H, the upper film 251 is cut. In this instance, the moment the upper film 251 is cut by the laser beam, the main protective pattern 237 is first exposed to the laser beam. Thus, the first and second link lines 224a and 224b formed under the main protective pattern 237 is not damaged. In addition, in the instance of the first link lines 224a, since the auxiliary protective pattern 227 serves to block the laser beam, it can be reliably protected.

Namely, in the second embodiment of the invention, by forming a predetermined protective pattern in the region overlapping with the first and second link lines 224a and 224b, the first and second link lines 224a and 224b can be prevented from being damaged.

Thus, the main protective pattern 237 may include only any one of the first to fourth protective layers 231b, 232b, 233b, and 235b, or any combinations thereof. Also, when the main protective pattern 237 is formed, the formation of the auxiliary protective pattern 227 may be omitted.

However, in terms of protection against a laser beam, a thickness and a material of the protective pattern are important factors. Thus, the main protective pattern 237 is required to be formed to have a thickness sufficient not to be damaged by a laser beam, or sufficient to prevent damage to the first link 224a and the second link 224b.

As a result, in order to reliably prevent damage, preferably, but not necessarily, the main protective pattern 237 includes four or more sub-patterns. Meanwhile, a polyimide-based material has excellent characteristics of absorbing laser. Thus, preferably, but not necessarily, the main protective pattern 237 includes the third protective layer 233b.

After the cutting process is terminated, the cut upper film 251 is removed, exposing the driving circuit part. The display panel may be detached from the mother substrate 205 and a lower film may be attached to a lower surface of the display panel.

Meanwhile, in FIGS. 8A to 8H, the main protective pattern 237 and the auxiliary protective pattern 227 are formed as a single pattern. However, in the second embodiment of the invention, the main and auxiliary protective patterns 227 and 237 may be formed as a plurality of patterns, and the respective patterns may overlap with at least one link line.

Figure 9A:
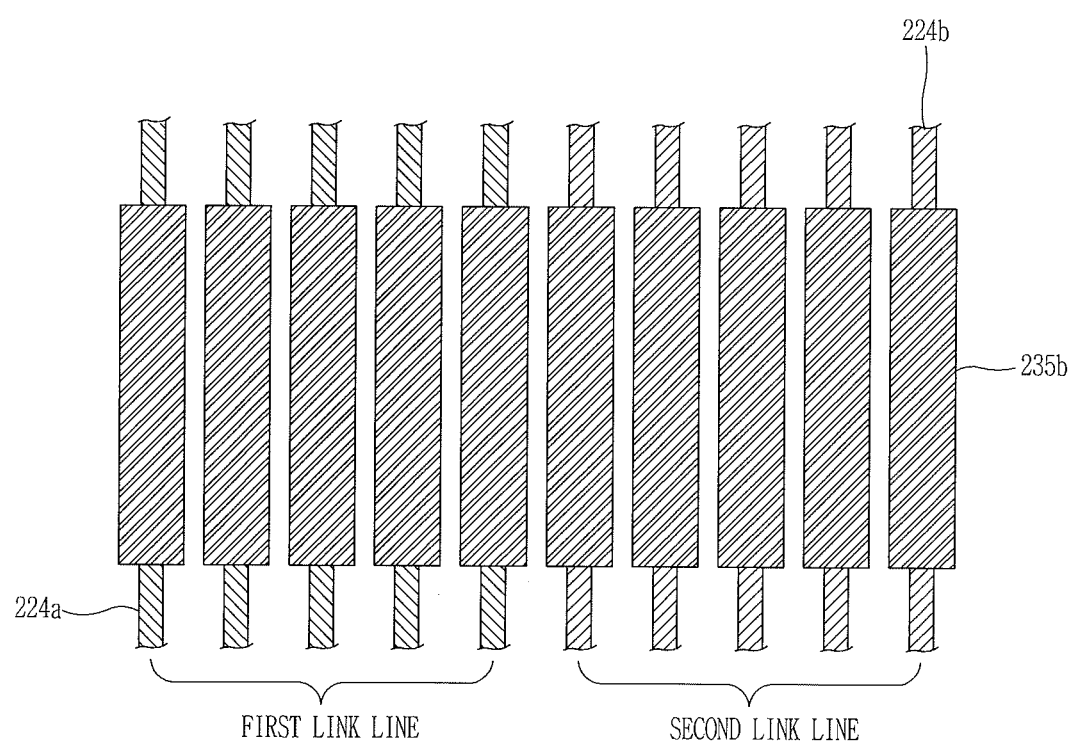
FIGS. 9A and 9B are plan views of a main protective pattern according to the second embodiment of the invention.
Figure 9B:
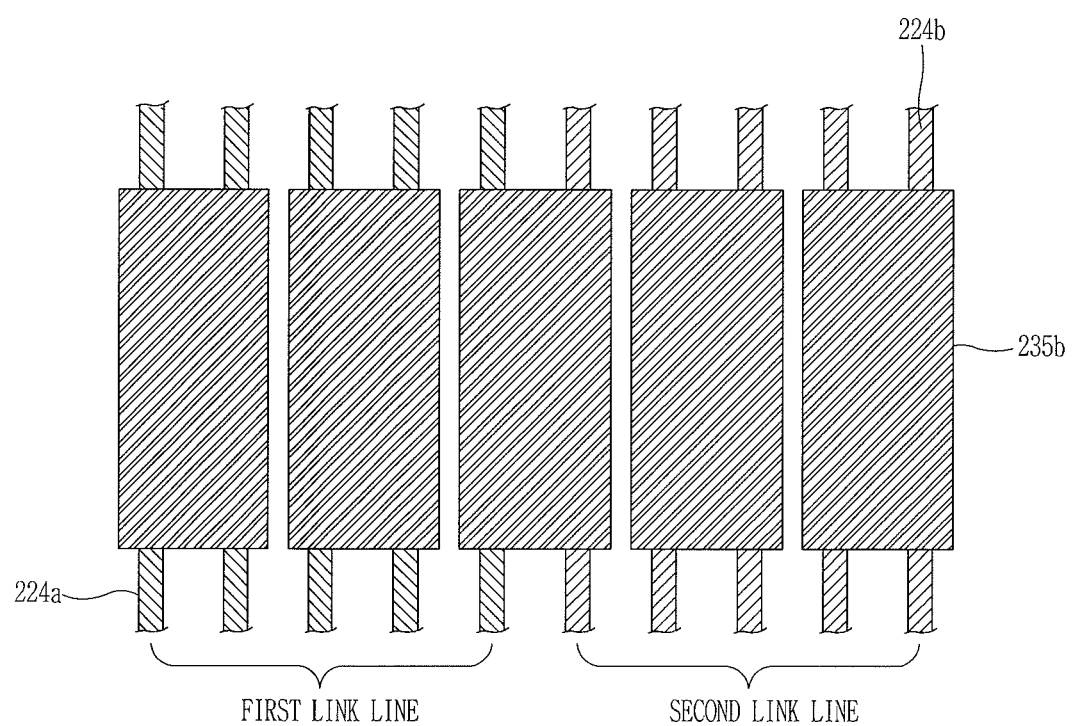

FIGS. 9A and 9B are plan views of a main protective pattern according to the second embodiment of the invention. In FIGS. 9A and 9B, it is illustrated that the main protective pattern 237 includes only the fourth protective layer.

FIG. 9A shows an instance in which every one main protective pattern 237 overlaps with every one link line 224a or 224b. FIG. 9B shows an instance in which every one single main protective pattern 237 overlaps with every two link lines 224a and 224b.

In this instance, noise with respect to the link lines can be reduced, in comparison to the instance in which the main protective pattern 237 is formed as a single pattern. Preferably, but not necessarily, in the instance illustrated in FIG. 9A, an influence on the link lines 224a and 224b is the smallest.

Thus, in this instance, reliability of the product can be further enhanced by reducing the influence on the driving of the display panel.

The foregoing embodiments and advantages are simply examples and are not to be considered as limiting the invention. The teachings can be readily applied to other types of apparatuses. This description is intended to be illustrative, and not to limit the scope of the claims. Many alternatives, modifications, and variations will be apparent to those skilled in the art. The features, structures, methods, and other characteristics of the example embodiments described herein may be combined in various ways to obtain additional and/or alternative example embodiments.

As the features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A flat panel display device comprising:
   a display panel including a display part to display an image, a driving circuit part to drive the display part, and a boundary part defining a boundary between the display part and the driving circuit part and having link lines connecting the display part and the driving circuit part;
   an upper film attached to an upper surface of the display panel; and
   a protective pattern directly attached on a lower surface of the upper film at a region of the upper film that corresponds to the boundary part,
   wherein the protective pattern reflects light.

2. The flat panel display device of claim 1, wherein the protective pattern is a single pattern and is made of metal.

3. A flat panel display device comprising:
   a display panel including a display part to display an image, a driving circuit part to drive the display part, and a boundary part defining a boundary between the display part and the driving circuit part and having link lines connecting the display part and the driving circuit part;
   an upper film attached to an upper surface of the display panel; and
   a main protective pattern in a region of the display panel that corresponds to the link lines in the boundary part of the display panel,
   wherein the main protective pattern includes a plurality of sub patterns,
   wherein at least one of the plurality of sub patterns absorbs light, and
   wherein at least one of the plurality of sub patterns is a transparent conductive material.

4. The flat panel display device of claim 3, wherein the main protective pattern is configured as a plurality of patterns overlapping with the same amount of link lines, respectively.

5. The flat panel display device of claim 3, wherein the boundary part is divided into a first boundary part and a second boundary part, and the link lines are divided into first link lines in the first boundary part to transfer a gate signal and second link lines in a layer different from that of the first link lines in the second boundary part to transfer a data signal, and the flat panel display device further comprising:
   an auxiliary protective pattern on a same layer on which one of the first and second link lines is formed in an upper side of an insulating layer, and overlapping with the other of the first and second link lines formed in a lower side of the insulating layer.

6. The flat panel display device of claim 3, wherein the main protective pattern includes polyimide (PI).

7. The flat panel display device of claim 1, wherein the display panel is an organic light emitting display panel encapsulated by a polyimide substrate, a glass substrate, or an adhesive layer.

8. The flat panel display device of claim 3, wherein the display panel is an organic light emitting display panel encapsulated by a polyimide substrate, a glass substrate, or an adhesive layer.

9. The flat panel display device of claim 1, wherein the upper film is a protective film or a polarizer film.

10. The flat panel display device of claim 3, wherein the upper film is a protective film or a polarizer film.

\* \* \* \* \*